United States Patent
Ichikawa et al.

(10) Patent No.: US 10,930,523 B2
(45) Date of Patent: Feb. 23, 2021

(54) METHOD FOR MANUFACTURING RESIN-SEALED POWER SEMICONDUCTOR DEVICE

(71) Applicant: Mitsubishi Electric Corporation, Tokyo (JP)

(72) Inventors: Keitaro Ichikawa, Tokyo (JP); Ken Sakamoto, Tokyo (JP); Kazuo Funahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 16/078,642

(22) PCT Filed: Mar. 29, 2016

(86) PCT No.: PCT/JP2016/059998
§ 371 (c)(1),
(2) Date: Aug. 22, 2018

(87) PCT Pub. No.: WO2017/168537
PCT Pub. Date: Oct. 5, 2017

(65) Prior Publication Data
US 2019/0051539 A1  Feb. 14, 2019

(51) Int. Cl.
*H01L 21/48* (2006.01)
*H01L 23/50* (2006.01)
(Continued)

(52) U.S. Cl.
CPC ........ *H01L 21/4842* (2013.01); *H01L 21/565* (2013.01); *H01L 23/3121* (2013.01);
(Continued)

(58) Field of Classification Search
CPC ............... H01L 21/4842; H01L 23/49541; H01L 23/48
See application file for complete search history.

(56) References Cited

U.S. PATENT DOCUMENTS

| 9,202,765 B2 * | 12/2015 | Wang ............... H01L 23/31 |
| 2002/0020929 A1 * | 2/2002 | Kasuga ............. H01L 21/565 |
| | | 257/787 |

(Continued)

FOREIGN PATENT DOCUMENTS

| JP | H06-005758 A | 1/1994 |
| JP | H11-319977 A | 11/1999 |
| JP | 2013-239625 A | 11/2013 |

OTHER PUBLICATIONS

International Search Report issued in PCT/JP2016/059998; dated Jun. 7, 2016.

*Primary Examiner* — Laura M Menz
*Assistant Examiner* — Khatib A Rahman
(74) *Attorney, Agent, or Firm* — Studebaker & Brackett PC (57) ABSTRACT

It is an object of the present invention to provide a method for manufacturing a resin-sealed power semiconductor device that facilitates the separation of a suspension lead from a mold resin and a lead frame. A method for manufacturing a resin-sealed power semiconductor device according to the present invention includes the following steps: (a) sealing a semiconductor element and a lead frame, to prepare a sealed body in which a terminal lead and a suspension lead that are included in the lead frame project outward from a side of the mold resin; (b) punching a portion of the suspension lead, the portion projecting from the mold resin, with a first punch in a first direction, to separate the suspension lead from the mold resin; and (c) punching the projecting portion of the suspension lead with a second punch in a second direction.

7 Claims, 5 Drawing Sheets

(51) Int. Cl.
  *H01L 23/48*    (2006.01)
  *H01L 21/56*    (2006.01)
  *H01L 23/31*    (2006.01)
  *H01L 23/42*    (2006.01)
  *H01L 23/495*   (2006.01)

(52) U.S. Cl.
  CPC .............. *H01L 23/42* (2013.01); *H01L 23/48* (2013.01); *H01L 23/49517* (2013.01); *H01L 23/49541* (2013.01); *H01L 23/50* (2013.01)

(56) References Cited

U.S. PATENT DOCUMENTS

| | | | | |
|---|---|---|---|---|
| 2002/0024127 A1* | 2/2002 | Sakuraba | .............. | H01L 21/565 257/686 |
| 2005/0116327 A1* | 6/2005 | Danno | .............. | H01L 23/49524 257/678 |
| 2007/0232027 A1* | 10/2007 | Kumamoto | ............... | B26F 1/14 438/460 |
| 2008/0061413 A1* | 3/2008 | Otremba | ........... | H01L 23/49562 257/676 |
| 2011/0198739 A1* | 8/2011 | Amanai | .................. | H01L 24/29 257/667 |
| 2011/0300670 A1* | 12/2011 | Tanaka | .............. | H01L 23/49541 438/122 |
| 2012/0196405 A1* | 8/2012 | Sakamoto | ........... | H01L 23/3107 438/123 |
| 2013/0341779 A1* | 12/2013 | Sakamoto | ........... | H01L 21/4842 257/676 |
| 2014/0225239 A1* | 8/2014 | Kimura | ................. | H01L 21/568 257/666 |
| 2014/0353814 A1* | 12/2014 | Sakamoto | ........ | H01L 23/49568 257/712 |
| 2016/0190115 A1* | 6/2016 | Shigematsu | ............ | H01L 24/97 438/123 |
| 2018/0040487 A1* | 2/2018 | Takahashi | ................ | H01L 23/28 |
| 2019/0291160 A1* | 9/2019 | Fortmeier | ................ | B21D 28/16 |

\* cited by examiner

METHOD FOR MANUFACTURING RESIN-SEALED POWER SEMICONDUCTOR DEVICE

TECHNICAL FIELD

The present invention relates to a method for manufacturing a resin-sealed power semiconductor device.

BACKGROUND ART

Resin-sealed power semiconductor devices each include a conductor stacked on an insulating substrate dissipating heat, a power semiconductor elements joined to the conductor, and a wire electrically conducting the power semiconductor element and a terminal lead together. The insulating substrate, the conductor, the power semiconductor element, and the wire are sealed with a mold resin. The terminal lead extends outward from a side of the mold resin. The terminal lead has one end connected to the wire and positioned inside the resin, and the other end positioned outside the resin. It is noted that such a resin seal type is also referred to as a transfer mold type.

The power semiconductor element is electrically connected to a lead frame, and is connected to the terminal lead through the wire in the production of such a resin-sealed power semiconductor device. The lead frame includes the terminal lead and a suspension lead that is not electrically connected to the semiconductor element. The suspension lead is used to enhance wire-bonding performance in a wire-bonding step of connecting the wire to the power semiconductor element and the terminal lead, or is used to fix a semiconductor device, such as a power semiconductor device in a resin-sealing step. After the resin-sealing step, the suspension lead projects outward from a side of the mold resin; that is, the mold resin is connected to the lead frame through the suspension lead. In the suspension lead, a portion projecting from the mold resin is separated from the mold resin and the lead frame with a tool, such as a punch.

A technique of suspension-lead separation from the mold resin and the lead frame has been conventionally disclosed (c.f., Patent Document 1).

PRIOR ART DOCUMENT

Patent Document

Patent Document 1: Japanese Patent Application Laid-Open No. 2013-239625

SUMMARY

Problem to be Solved by the Invention

Patent Document 1 describes, in a comparative example, that the suspension lead is separated from the mold resin and the lead frame through a one-time punching step with the mold resin and the lead frame connected to the suspension lead (c.f., Patent Document 1; FIGS. 7 to 9). This separation unfortunately produces a burr in a separated portion between the lead frame and the suspension lead. Meanwhile, Patent Document 1 requires slits in the lead frame in order to solve this problem in the comparative example.

The present invention has been made to solve the above problem. It is an object of the present invention to provide a method for manufacturing a resin-sealed power semiconductor device that facilitates the separation of a suspension lead from a mold resin and a lead frame.

Means to Solve the Problem

To solve the above problem, the present invention provides a method for manufacturing a resin-sealed power semiconductor device, including the following steps: (a) sealing a semiconductor element and a lead frame electrically connected to the semiconductor element with a mold resin, to prepare a sealed body in which a terminal lead and a suspension lead that are included in the lead frame project outward from a side of the mold resin; (b) punching a portion of the suspension lead, the portion projecting from the mold resin, with a first punch in a first direction oriented from a one-main-surface side of the mold resin to an other-main-surface side opposite the one main surface, to separate the suspension lead from the mold resin; and (c) punching the projecting portion of the suspension lead with a second punch in a second direction oriented from the other-main-surface side of the mold resin to the one-main-surface side, to separate the suspension lead from the lead frame.

Effects of the Invention

According to the present invention, the method for manufacturing a resin-sealed power semiconductor device includes the following steps: (a) sealing a semiconductor element and a lead frame electrically connected to the semiconductor element with a mold resin, to prepare a sealed body in which a terminal lead and a suspension lead that are included in the lead frame project outward from a side of the mold resin; (b) punching a portion of the suspension lead, the portion projecting from the mold resin, with a first punch in a first direction oriented from a one-main-surface side of the mold resin to an other-main-surface side opposite the one main surface, to separate the suspension lead from the mold resin; and (c) punching the projecting portion of the suspension lead with a second punch in a second direction oriented from the other-main-surface side of the mold resin to the one-main-surface side, to separate the suspension lead from the lead frame. The method facilitates the separation of the suspension lead from the mold resin and the lead frame.

These and other objects, features, aspects and advantages of the present invention will become more apparent from the following detailed description of the present invention when taken in conjunction with the accompanying drawings.

DESCRIPTION OF EMBODIMENT(S)

The following describes an embodiment of the present invention with reference to the drawings.

Embodiment

Figure 1:
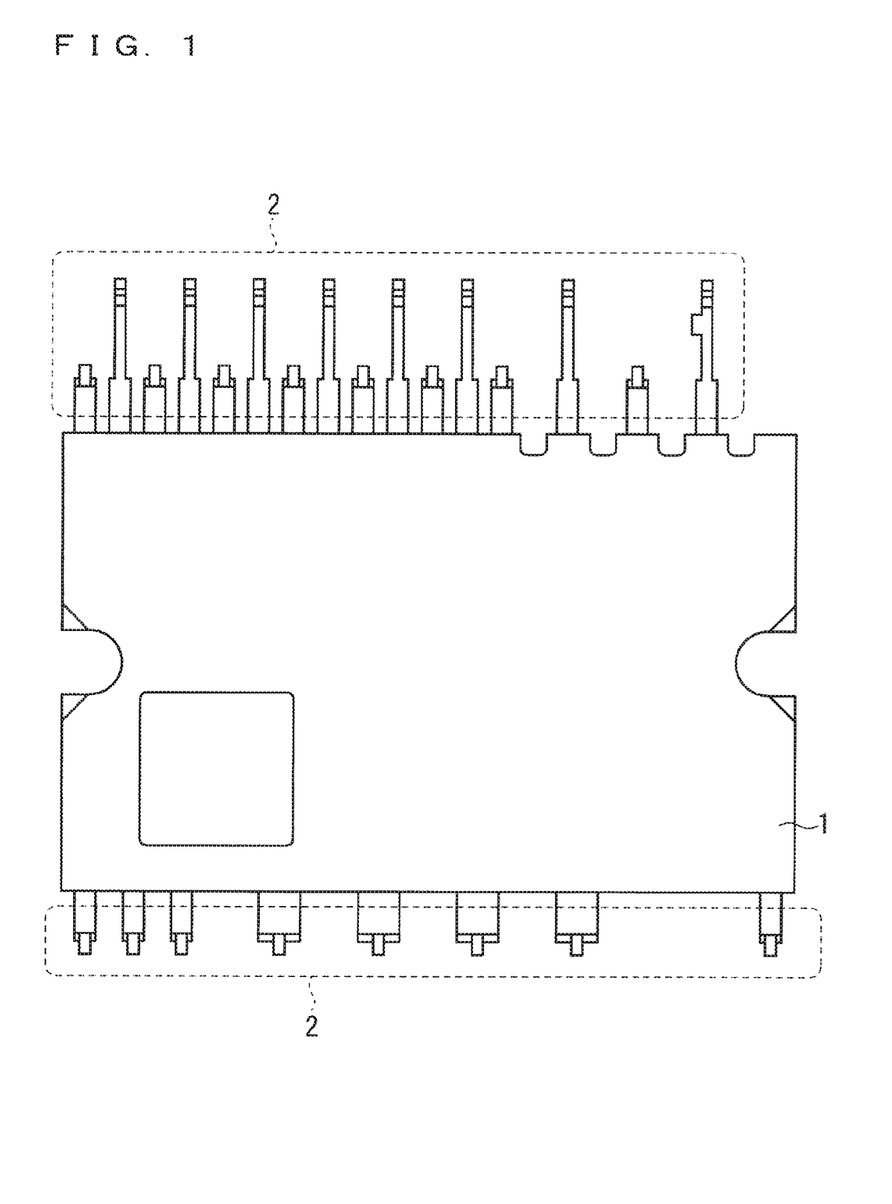
FIG. 1 is a plan view of one example of a resin-sealed power semiconductor device according to an embodiment of the present invention.

FIG. 1 is a plan view of one example of a resin-sealed power semiconductor device according to the embodiment of the present invention.

The resin-sealed power semiconductor device includes a semiconductor element (not shown) that is electrically connected to a copper lead frame and is a PW chip, a semiconductor element (not shown) that is electrically connected to the copper lead frame and is an IC chip, and a plurality of wires (not shown) electrically connecting terminal leads 2 of the lead frame and each semiconductor element together. These components are sealed with a mold resin 1. The terminal leads 2 project outward from the sides of the mold resin 1. The plurality of wires include thick wires and thin wires. It is noted that the lead frame corresponds to a lead frame 4 in FIG. 2, which will be described later on.

FIGS. 2 to 5 illustrate examples of process steps for manufacturing the resin-sealed power semiconductor device according to the embodiment. It is noted that the steps in FIGS. 2 to 5 are preformed through a well-known tie-bar cut process (T/C process) or a well-known lead cut process (L/C process).

Figure 2:
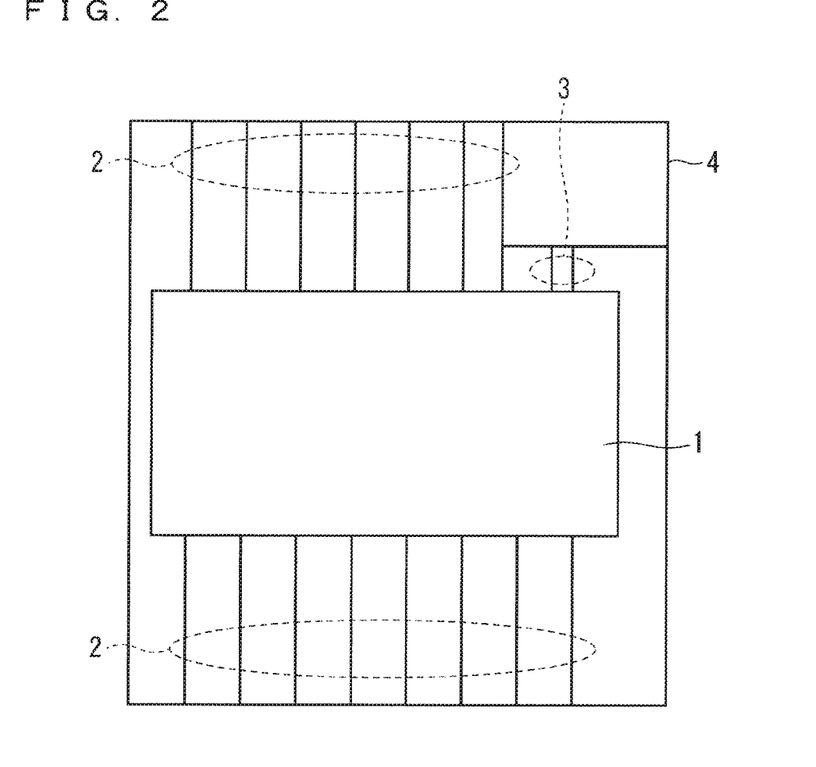
FIG. 2 is a plan view of one example of a step for manufacturing the resin-sealed power semiconductor device according to the embodiment of the present invention.

As illustrated in FIG. 2, the semiconductor elements and the lead frame 4, which is electrically connected to the semiconductor elements, are sealed with the mold resin 1, to prepare a sealed body in which the terminal lead 2 and a suspension lead 3 that are included in the lead frame 4 project outward from the side of the mold resin 1.

Figure 3:
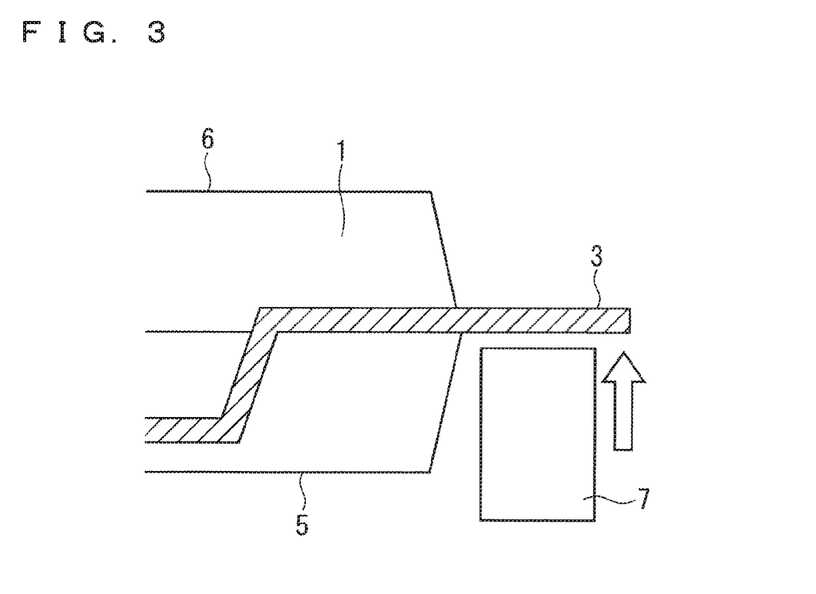
FIG. 3 is a cross-sectional view of one example of a step for manufacturing the resin-sealed power semiconductor device according to the embodiment of the present invention.
Figure 4:
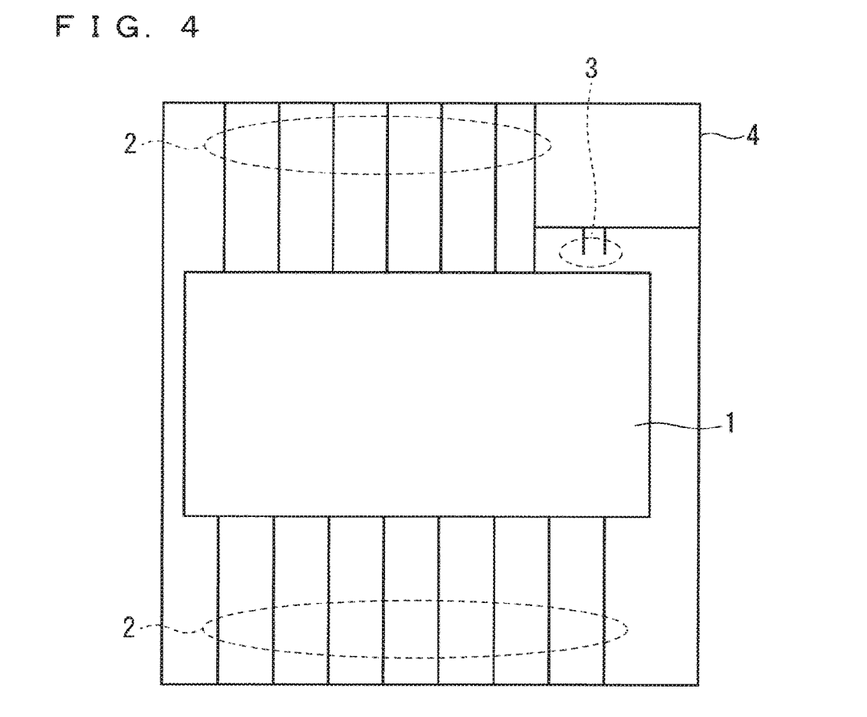
FIG. 4 is a plan view of one example of a step for manufacturing the resin-sealed power semiconductor device according to the embodiment of the present invention.

As illustrated in FIG. 3, a portion of the suspension lead 3, the portion projecting from the mold resin 1, next undergoes punching with a punch 7 that is a first punch in a first direction oriented from a heat-dissipation-surface-5 side that is one main surface of the mold resin 1 to an upper-surface-6 side that is the other main surface opposite the heat dissipation surface, to be separated from the mold resin 1. As illustrated in FIG. 4, the suspension lead 3 is connected to the lead frame 4 while separated from the mold resin 1 at this time. It is noted that the first direction corresponds to a direction indicated by an arrow in FIG. 3.

Figure 5:
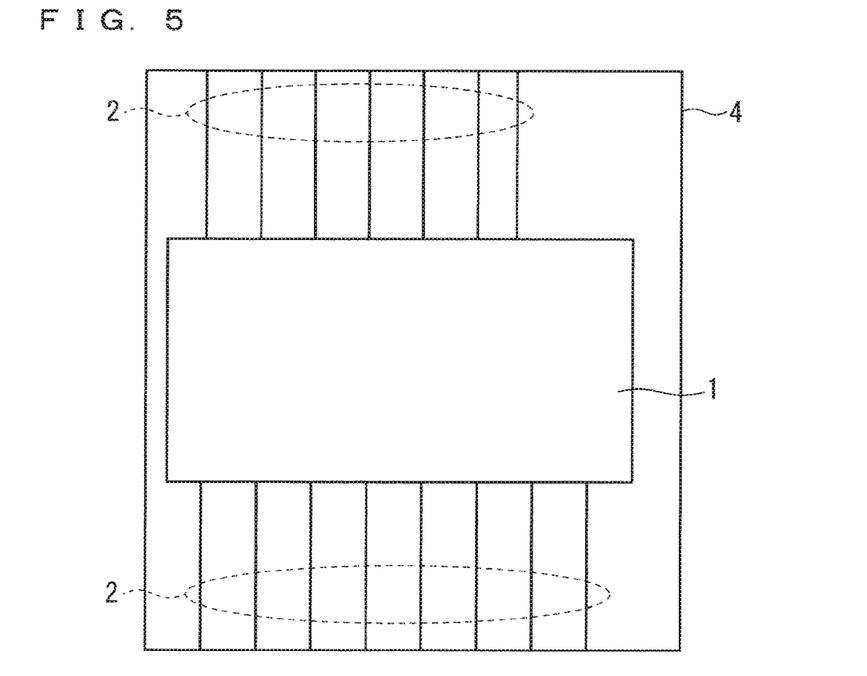
FIG. 5 is a plan view of one example of a step for manufacturing the resin-sealed power semiconductor device according to the embodiment of the present invention.

The suspension lead 3, which is connected to the lead frame 4, next undergoes punching with a second punch (not shown) in a second direction oriented from the upper-surface-6 side of the mold resin 1 to the heat-dissipation-surface-5 side, to be separated from the lead frame 4. FIG. 5 illustrates the suspension lead 3 as separated from the lead frame 4.

Then, the lead frame 4 coupling the individual terminal leads 2 together is separated, followed by a process such as cutting off the terminal leads 2 while adjusting their lengths. This completes the resin-sealed power semiconductor device illustrated in FIG. 1.

Figure 6:
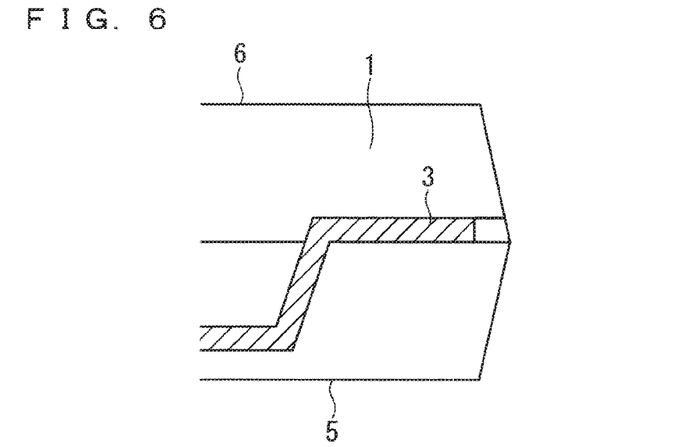
FIG. 6 is a cross-sectional view of one example of a suspension lead in the resin-sealed power semiconductor device according to the embodiment of the present invention.
Figure 7:
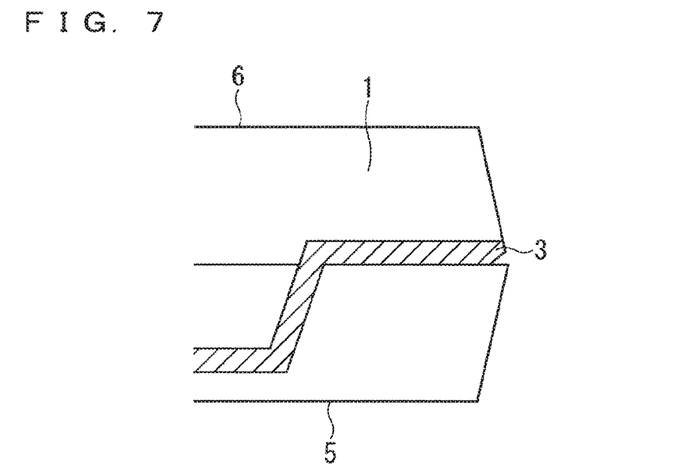
FIG. 7 is a cross-sectional view of one example of the suspension lead in the resin-sealed power semiconductor device according to the embodiment of the present invention.

FIGS. 6 and 7 are each a cross-sectional view of one example of the suspension lead 3 in the resin-sealed power semiconductor device.

Once separated from the mold resin 1 with the punch 7 as illustrated in FIG. 3, the suspension lead 3, as illustrated in FIG. 6, is pulled out from the inside of the mold resin 1; that is, a tip of the lead 3 is positioned inside the mold resin 1. Alternatively, as illustrated in FIG. 7, the tip of the suspension lead 3 is oriented upward in the vicinity of a side surface of the mold resin 1, and has a sagging shape on the heat-dissipation-surface-5 side. The sagging shape herein means a shape in which the tip of the suspension lead 3 is bent in a certain direction as illustrated in FIG. 7.

Figure 8:
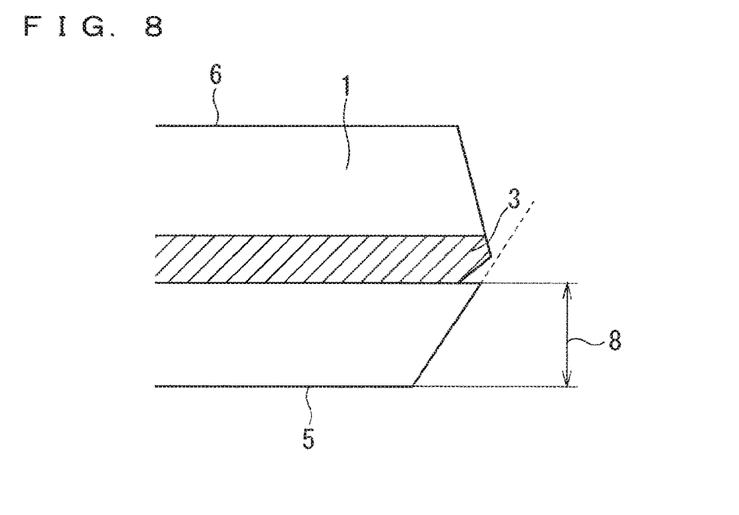
FIG. 8 is a cross-sectional view of one example of the suspension lead in the resin-sealed power semiconductor device according to the embodiment of the present invention.

In this way, the resin-sealed power semiconductor device according to the embodiment is structured such that the suspension lead 3 does not project from the mold resin 1. The structure in which the suspension lead 3 does not project from the mold resin 1 herein means, as illustrated in FIG. 8, a structure in which the tip of the suspension lead 3 is positioned on a mold-resin-1 side with respect to a dashed line elongating from the side surface adjacent to the heat dissipation surface of the mold resin 1.

As described above, the suspension lead is provided to enhance wire-bonding performance without a deviation of the lead frame 4 in a wire-bonding step of connecting the thin wires to the semiconductor elements and the terminal leads 2 together when the resin-sealed power semiconductor device is produced.

Figure 9:
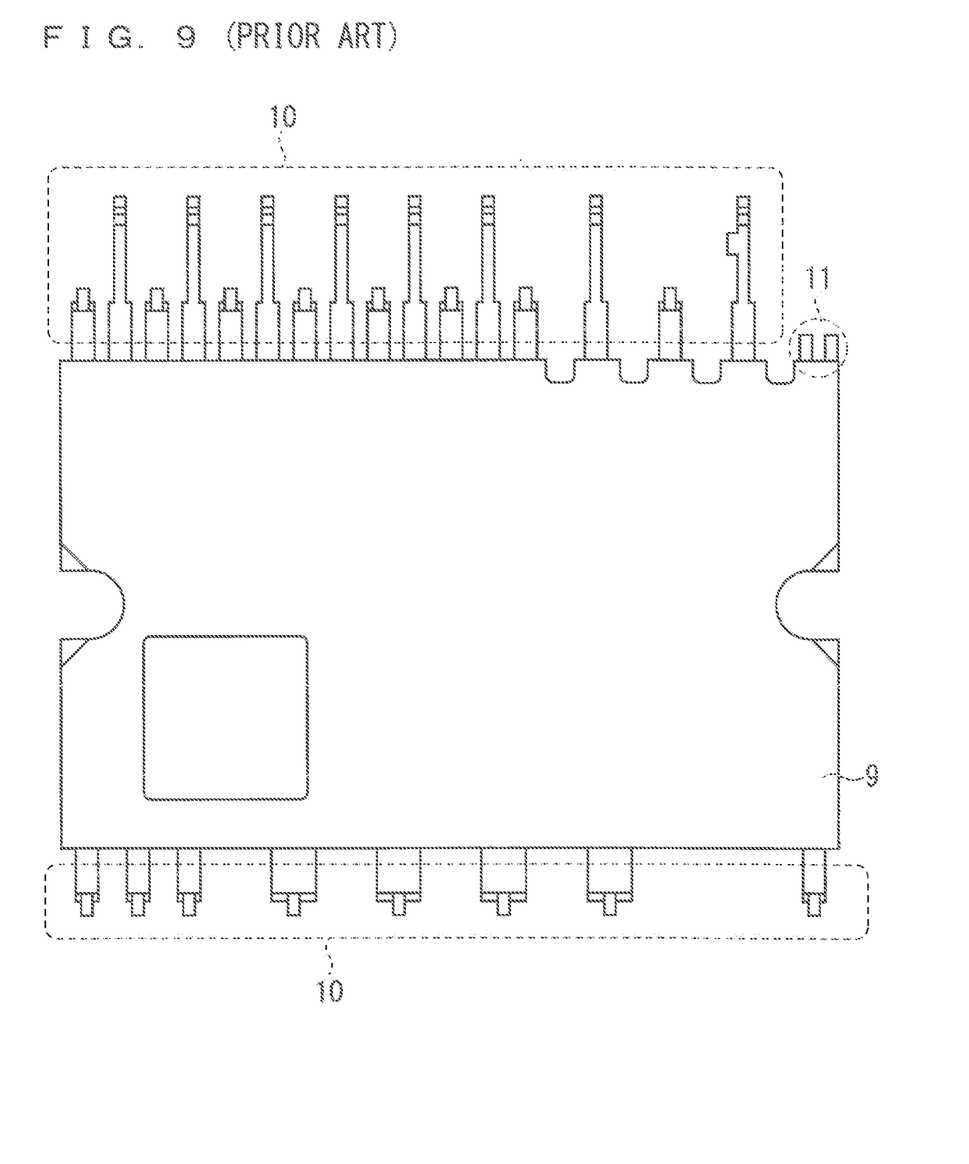
FIG. 9 is a plan view of one example of a conventional resin-sealed power semiconductor device.

As illustrated in FIG. 9, a suspension lead 11 is conventionally cut off through a tie-bar cut process or a lead cut process after a mold resin 9 is formed, and the suspension lead 11 after cut-off remains projecting from the mold resin 9.

Inherently, suspension leads are not electrically connected to semiconductor elements and are thus insulated from them. In recent years, however, the semiconductor elements have been developed to be more resistant to high voltage; in addition, products have been developed to be smaller. These developments involve a reduction in creepage distance between coolers mounted on heat dissipation surfaces of resin-sealed power semiconductor devices and the suspension leads, thereby easily producing poor insulation. Further, the suspension lead, if projecting from a mold resin, can be deformed by handling after the processing or during the mounting of the resin-sealed power semiconductor device. This unfortunately causes the suspension lead to be energized, or reduces the insulation performance of the resin-sealed power semiconductor device.

The present embodiment prevents electric-field concentration at the tip of the suspension lead 3, which is sharp, when the tip of the suspension lead 3 after separation is positioned inside the mold resin 1 as illustrated in FIG. 6. Further, as illustrated in FIGS. 6 and 7, the tip of the suspension lead 3 does not project from the mold resin 1. This avoids the energization resulting from the deformation.

Still further, as illustrated in FIG. 7, the tip of the suspension lead 3 after separation is oriented upward in the vicinity of the side surface of the mold resin 1, and has a sagging shape on the heat-dissipation-surface-5 side. This enables the tip of the suspension lead 3, which is sharp, to be remote from the heat dissipation surface 5, thereby enhancing dielectric strength against the heat dissipation surface 5. As illustrated in FIG. 8 for instance, a clearance 8 that is a distance between the heat dissipation surface 5 and a surface of the suspension lead 3 on the heat-dissipation-surface-5 side is set to be 1.6 mm or greater in this case. This enables the dielectric strength to have a level of 2.0 kVrms or greater.

Yet further, the suspension lead 3 undergoes punching with the punch 7 in the direction oriented from the heat dissipation surface 5 toward the upper surface 6, to be separated from the mold resin 1. Consequently, a portion of the mold resin 1 on the heat-dissipation-surface-5 side with respect to the suspension lead 3 is less likely to have chipping. This lowers the likelihood that the creepage distance is no longer maintained due to a defect, such as chipping.

Still yet further, the suspension lead 3 firstly undergoes punching with the punch 7 in the direction oriented from the heat dissipation surface 5 toward the upper surface 6, i.e., from below to above, to be separated from the mold resin 1. The suspension lead 3 then undergoes punching with the punch in the direction oriented from the upper surface 6 toward the heat dissipation surface 5, i.e., from above to below, to be separated from the lead frame 4. This series of process steps facilitates the separation of the suspension lead from the mold resin and the lead frame, and enables the suspension lead 3, which is now unnecessary, to be smoothly discarded downward.

The embodiment describes the resin-sealed power semiconductor device in FIG. 1 as one example. The resin-sealed power semiconductor device may have any other configuration. The embodiment is applicable regardless of the shape of the mold resin or the position of the suspension lead in the lead frame.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 mold resin, 2 terminal lead, 3 suspension lead, 4 lead frame, 5 heat dissipation surface, 6 upper surface, 7 punch, 8 clearance, 9 mold resin, 10 terminal lead, 11 suspension lead.

The invention claimed is:

1. A method for manufacturing a resin-sealed power semiconductor device, comprising the steps of:
   (a) sealing a semiconductor element and a lead frame electrically connected to the semiconductor element with a mold resin, to prepare a sealed body in which a terminal lead and a suspension lead that are directly connected to the lead frame project outward from a side of the mold resin, wherein the terminal lead, the suspension lead and the lead frame are different elements;
   (b) punching a portion of the suspension lead, the portion projecting from the mold resin, with a first punch in a first direction oriented from a one-main-surface side of the mold resin to an other-main-surface side opposite to the one-main-surface side, to separate the projecting portion of the suspension lead from the mold resin; and
   (c) punching the projecting portion of the suspension lead with a second punch in a second direction oriented from the other-main-surface side of the mold resin to the one-main-surface side, to separate the suspension lead from the lead frame.

2. The method for manufacturing a resin-sealed power semiconductor device according to claim 1, wherein the one-main-surface side is a heat dissipation surface of the mold resin.

3. The method for manufacturing a resin-sealed power semiconductor device according to claim 2, wherein the step (c) is performed after the step (b).

4. The method for manufacturing a resin-sealed power semiconductor device according to claim 1, wherein in the step (b), a tip of the suspension lead located within the mold resin, the tip being located on a separation side, is separated so as not to project from the mold resin.

5. The method for manufacturing a resin-sealed power semiconductor device according to claim 2, wherein a distance between the one-main-surface side of the mold resin and a surface of the suspension lead on the one-main-surface side is 1.6 mm or greater.

6. A method for manufacturing a resin-sealed power semiconductor device, comprising the steps of:
   (a) sealing a semiconductor element and a lead frame electrically connected to the semiconductor element with a mold resin, to prepare a sealed body in which a terminal lead and a suspension lead that are directly connected to the lead frame project outward from a side of the mold resin;
   (b) punching a portion of the suspension lead, the portion projecting from the mold resin, with a first punch in a first direction oriented from a one-main-surface side of the mold resin to an other-main-surface side opposite to the one-main-surface side, to separate the projecting portion of the suspension lead from the mold resin; and
   (c) punching the projecting portion of the suspension lead with a second punch in a second direction oriented from the other-main-surface side of the mold resin to the one-main-surface side, to separate the suspension lead from the lead frame, such that the terminal lead is coupled to the lead frame when the suspension lead is separated from the lead frame.

7. A method for manufacturing a resin-sealed power semiconductor device, comprising the steps of:
   (a) sealing a semiconductor element and a lead frame electrically connected to the semiconductor element with a mold resin, to prepare a sealed body in which a terminal lead and a suspension lead that are directly connected to the lead frame project outward from a side of the mold resin;
   (b) punching a portion of the suspension lead, the portion projecting from the mold resin, with a first punch in a first direction oriented from a one-main-surface side of the mold resin to an other-main-surface side opposite to the one-main-surface side, to separate the projecting portion of the suspension lead from the mold resin; and
   (c) punching the projecting portion of the suspension lead with a second punch in a second direction oriented from the other-main-surface side of the mold resin to the one-main-surface side, to separate the suspension lead from the lead frame, such that the terminal lead is electrically connected to the semiconductor element, and the suspension lead is not electrically connected to the semiconductor element.

* * * * *